US012775043B2

(12) United States Patent
Wagner

(10) Patent No.: US 12,775,043 B2
(45) Date of Patent: Oct. 27, 2026

(54) APPARATUS AND METHOD FOR PERFORMING A NETWORK DIAGNOSIS PROCEDURE

(71) Applicant: NXP B.V., Eindhoven (NL)

(72) Inventor: Martin Wagner, Norderstedt (DE)

(73) Assignee: NXP B.V., Eindhoven (NL)

( * ) Notice: Subject to any disclaimer, the term of this patent is extended or adjusted under 35 U.S.C. 154(b) by 48 days.

(21) Appl. No.: 18/962,189

(22) Filed: Nov. 27, 2024

(65) Prior Publication Data

US 2025/0199067 A1 Jun. 19, 2025

(30) Foreign Application Priority Data

Dec. 13, 2023 (EP) .................................... 23216411

(51) Int. Cl.

| | |
|---|---|
| ***G01R 31/30*** | (2006.01) |
| ***G01R 31/3183*** | (2006.01) |
| ***G01R 31/3185*** | (2006.01) |
| ***G01R 31/319*** | (2006.01) |

(52) U.S. Cl.

CPC ................ *G01R 31/318378* (2013.01); *G01R 31/318566* (2013.01); *G01R 31/31907* (2013.01)

(58) Field of Classification Search

None

See application file for complete search history.

(56) References Cited

U.S. PATENT DOCUMENTS

| | | | | |
|---|---|---|---|---|
| 6,691,056 | B2 | 2/2004 | Muth et al. | |
| 9,846,716 | B1 * | 12/2017 | Scott | G06F 16/955 |
| 10,594,587 | B2 | 3/2020 | Kim et al. | |
| 11,016,952 | B2 * | 5/2021 | Yin | G06F 16/2455 |
| 2003/0179712 | A1 * | 9/2003 | Kobayashi | H04L 5/16 710/24 |
| 2003/0208619 | A1 * | 11/2003 | Rossbach | H04L 63/0227 709/238 |
| 2014/0281737 | A1 * | 9/2014 | Compann | H04L 69/14 714/46 |

(Continued)

FOREIGN PATENT DOCUMENTS

| | | | |
|---|---|---|---|
| DE | 102017212544 | A1 | 1/2019 |
| EP | 3618363 | A1 | 3/2020 |
| WO | WO-2019115311 | A1 | 6/2019 |

*Primary Examiner* — Mujtaba M Chaudry

(57) ABSTRACT

An apparatus configured to perform a network diagnosis procedure within a message-based protocol network comprising a plurality of nodes. The apparatus comprises: a diagnosis test device configured to perform diagnosis tests; and a diagnosis control device. To perform the network diagnosis procedure, the diagnosis control device is configured to: receive a diagnosis request from a commander node wherein the diagnosis request is directed to a target node, and the diagnosis request comprises a first message identifier; compare the first message identifier to a predetermined diagnosis identifier; receive a diagnosis response from the target node, wherein the diagnosis response comprises a second message identifier and a test pattern; and compare the second message identifier to a predetermined diagnosis identifier; if the first message identifier and the second message identifier are identical to the predetermined diagnosis identifier: then use the diagnosis test device to perform a diagnosis test using the test pattern.

15 Claims, 7 Drawing Sheets

(56) References Cited

U.S. PATENT DOCUMENTS

| | | | | |
|---|---|---|---|---|
| 2016/0070625 | A1* | 3/2016 | Allu | G06F 11/1417 714/4.11 |
| 2019/0079842 | A1 | 3/2019 | Chae et al. | |
| 2020/0117580 | A1* | 4/2020 | Lekivetz | G06F 11/368 |
| 2021/0211905 | A1* | 7/2021 | Rimhagen | H04W 24/06 |
| 2022/0156175 | A1* | 5/2022 | Periyathambi | G06F 11/3688 |
| 2022/0206913 | A1* | 6/2022 | Kim | G06F 11/0772 |
| 2024/0007326 | A1 | 1/2024 | de Haas et al. | |

* cited by examiner

APPARATUS AND METHOD FOR PERFORMING A NETWORK DIAGNOSIS PROCEDURE

CROSS-REFERENCE TO RELATED APPLICATIONS

This application claims priority under 35 U.S.C. § 119 to European patent application no. 23216411.1, filed Dec. 13, 2023, the contents of which are incorporated by reference herein.

FIELD

The present disclosure relates to an apparatus for performing a network diagnosis procedure within a message-based protocol network, and an associated method.

SUMMARY

According to a first aspect of the present disclosure there is provided an apparatus configured to perform a network diagnosis procedure within a message-based protocol network comprising a plurality of nodes, the apparatus comprising:

- a diagnosis test device configured to perform diagnosis tests; and
- a diagnosis control device wherein, in order to perform the network diagnosis procedure, the diagnosis control device is configured to:
  - receive a diagnosis request from a commander node wherein the diagnosis request is directed to a target node, and wherein the diagnosis request comprises a first message identifier;
  - compare the first message identifier to a predetermined diagnosis identifier;
  - receive a diagnosis response from the target node, wherein the diagnosis response comprises a second message identifier and a test pattern; and
  - compare the second message identifier to a predetermined diagnosis identifier;
  - if the first message identifier and the second message identifier are identical to the predetermined diagnosis identifier:
    - then use the diagnosis test device to perform a diagnosis test using the test pattern.

In one or more embodiments, the diagnosis test is a disturbing diagnosis test.

In one or more embodiments, the disturbing diagnosis test is configured to disturb other signals in the message-based protocol network.

In one or more embodiments, the message-based protocol network is a controller area network, CAN, which comprises a first and second bus wire coupled to each node within the network.

In one or more embodiments, the diagnosis control device is configured to receive the diagnosis request from a transmit data, TXD, pin of the commander node. The diagnosis control device may be configured to receive the diagnosis response from a receive data, RXD, pin of the commander node.

In one or more embodiments, the diagnosis control device further comprises a timer, wherein the diagnosis control device is configured to start the timer in response to it receiving the diagnosis request. The diagnosis control device may be configured to terminate the network diagnosis procedure if the diagnosis control device does not receive the diagnosis response from within a predetermined time period of the timer starting.

In one or more embodiments, the diagnosis control device is configured to terminate the network diagnosis procedure if:

- the first message identifier is not identical to the predetermined diagnosis identifier; and/or
- the second message identifier is not identical to the predetermined diagnosis identifier.

In one or more embodiments, the diagnosis control device is configured to terminate the network diagnosis procedure if the test pattern is not identical to a predetermined test pattern.

In one or more embodiments, the predetermined test pattern is hardcoded.

In one or more embodiments, the diagnosis response comprises a header and a payload. The test pattern may be contained within the payload of the diagnosis response.

In one or more embodiments, the predetermined diagnosis identifier is hardcoded.

In one or more embodiments, the apparatus is configured to sequentially perform a diagnosis test for each node in the message-based protocol network.

According to a second aspect of the present disclosure there is provided a method for performing a network diagnosis procedure within a message-based protocol network, the method comprising:

- receiving a diagnosis request from a commander node wherein the diagnosis request is also directed to a target node, and wherein the diagnosis request comprises a first message identifier;
- receiving a diagnosis response from the target node, wherein the diagnosis response comprises a second message identifier and a predetermined test pattern;
- comparing the first message identifier and the second message identifier with a predetermined diagnosis identifier;
  - if the first message identifier and the second message identifier are identical to the predetermined diagnosis identifier, then using a diagnosis test device to perform a diagnosis test on the predetermined test pattern; and
  - if the first message identifier and the second message identifier are not identical to the predetermined diagnosis identifier, then terminating the network diagnosis procedure.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Many modern systems require a network which features a plurality of nodes. For example, modern cars are equipped with numerous electronic components, used for different functions. These modules are typically connected via networks like a controller area network (CAN), a local interconnect network (LIN) or Ethernet. Each function within a car is often realized by multiple components, that exchange data via the network. For example, an electric power steering module needs, for instance, exact information about the steering angle, the steering torque and the speed of the vehicle. Furthermore, many of these functions are relevant for the safety of the car. Due to the increasing number of modules and functions within modern car design, the requirements for safety and reliability within the network are increasing. Failures during communications or short interruptions can result in unforeseeable side-effects that might have an impact on the safety of the car. To ensure that, over the lifetime of the car, the communication is reliably working, appropriate diagnosis systems are used that detect potential failures, ideally before communication failures occur.

Figure 1:
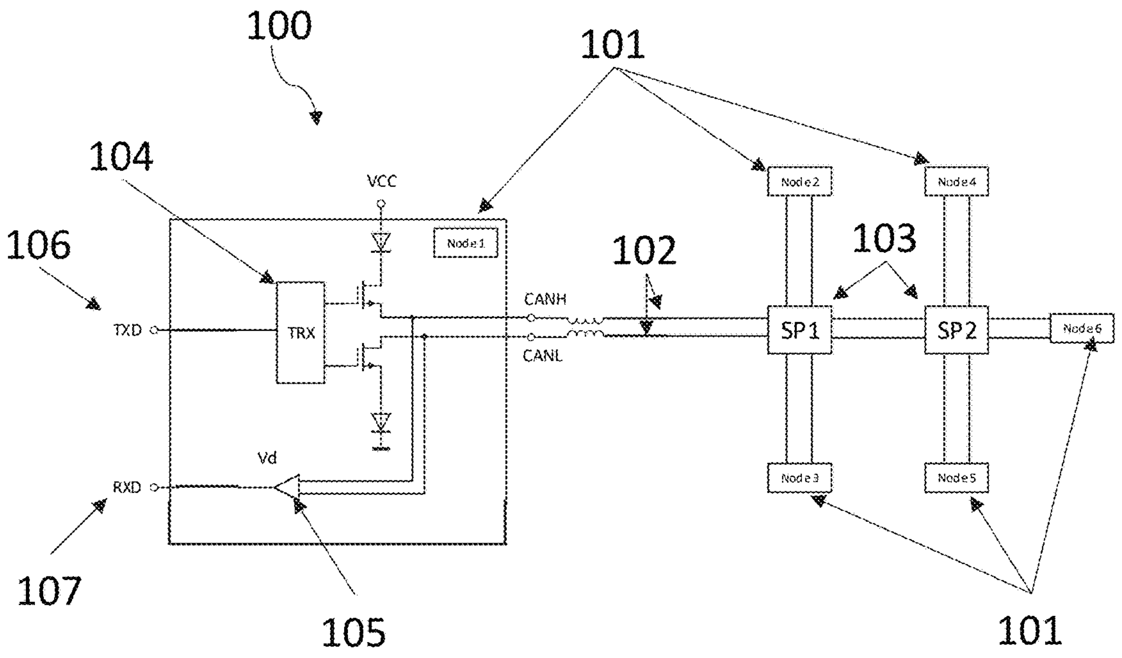
FIG. 1 shows an example embodiment of an example of a CAN network.

FIG. 1 shows an example of a CAN network 100. In FIG. 1, there is a plurality of nodes 101 connected to a CAN bus 102. The CAN bus 102 comprises two wires, CAN high (CANH) and CAN low (CANL). Using CANH and CANL, the nodes 101 within a CAN network 100 are able to transmit and receive differential signals by transmitting different voltages along each wire of the CAN bus 102, thereby creating a differential signal which can be interpreted by the other nodes 101. This particular CAN structure 100 contains two star points 103. The star points 103 are used to reduce the complexity of the bus 102 needed to connect each node 101 to each other node 101 in the network 100.

Each node 101 within the CAN network 100 includes a transceiver, comprising a transmitter 104 and a receiver 105. The transmitter 104 transmits signals to the bus 102, and the receiver 105 receives signals from the bus 102. Each node 101 is connected to a host controller (not shown) by way of a transmit data (TXD) pin 106 and a receive data (RXD) pin 107. The TXD pin 106 is used to provide signals for transmission by the transmitter 104 and the RXD pin 107 is used to provide data to the host controller (not shown) that has been received by the receiver 105.

A number of faults can occur within a network such as the CAN network 100 described in FIG. 1. For example, a network wire could be short-circuited to ground, or a wire could be interrupted. These faults can result in errors in the CAN network 100. Therefore, it can be beneficial for a network to introduce fault detection and diagnosis techniques in order to be equipped to mitigate these risks. In order to fix a fault, the position of the fault may need to be located within the network.

Figure 2:
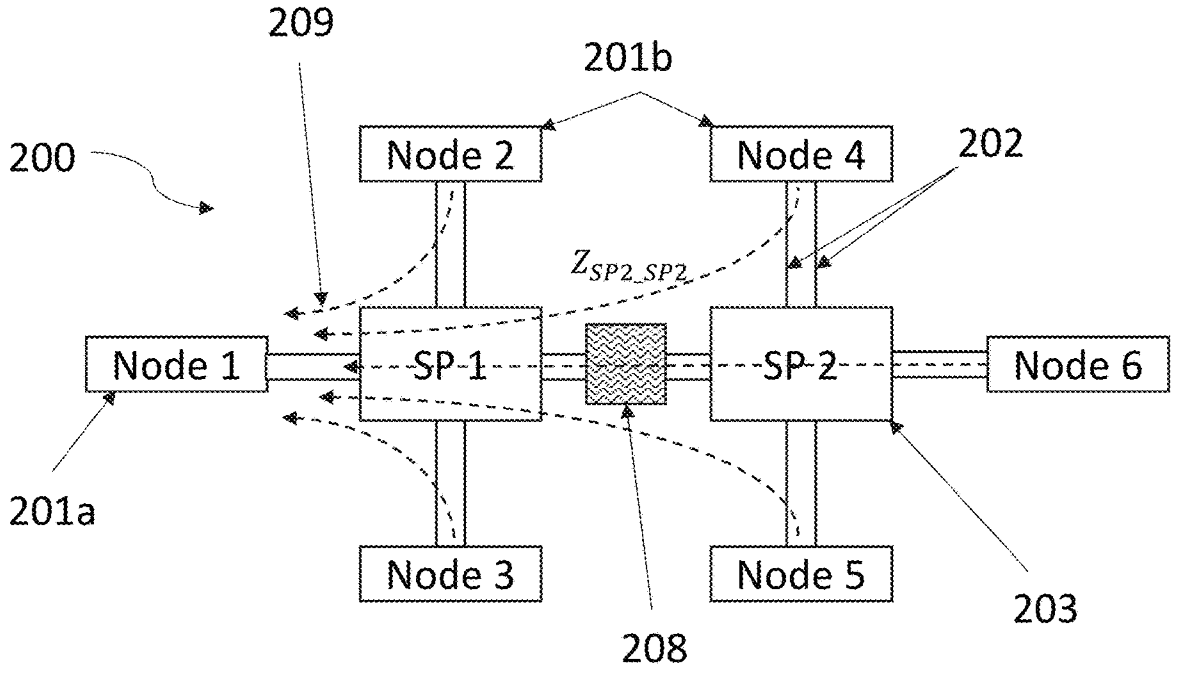
FIG. 2 shows an example CAN network which is used to describe a method to locate a fault within the network.

FIG. 2 shows an example CAN network 200 which can be used to describe a method to locate a fault within the network 200. In this example, an initiator node 201*a* has initiated a diagnosis test procedure in order to detect and locate an impedance fault 208 within the network 200. The initiator node 201*a* sequentially performs a diagnosis test with each other node 201*b* (responder node 201*b*) within the network 200. In this example, each diagnosis test measures the impedance of the network 200 in a path between the initiator node 201*a* and the corresponding responder node 201*b*, ignoring all other network 200 connections outside of this path. As a result of a diagnosis test, the initiator node 201*a* receives an impedance test measurement 209 for each responder node 201*b* that has been tested. Once each impedance test measurement 209 has been received, the host controller (not shown) corresponding to the initiator node 201*a* is able to compare the impedance test measurements 209 to one another in order to detect and locate the fault 208. Depending on the network topology, one or multiple faults 208 may be detected at the same time within the network 200.

In this example, the fault 208 is located between the two star points 203. Therefore, the impedances of the responder nodes 201*b* connected to the first star point 203 (SP1) will be equal to one another and the impedances of the responder nodes 201*b* connected to the second star point 203 (SP2) will be equal to one another. The two groups of equal impedances are different from one another, therefore a fault 208 (causing a change in impedance on the bus) must be located between the two star points 203. The magnitude of the impedance difference caused by the fault 208 can also be determined by assessing the difference in impedance between the two groups. Therefore, both the severity and location of a fault 208 can be determined.

Generally, two kind of diagnosis systems can be distinguished: non-disturbing and disturbing systems. Non-disturbing systems allow measurements without impairing the communication. A disturbing system takes measurements that influence the communication or even distract it completely.

Non-disturbing diagnosis systems allow continuous monitoring of the network during operation (e.g., of a car); i.e., when active communication is ongoing. This allows the non-disturbing diagnosis methods to detect failures as soon as possible. However, some kinds of failures cannot be detected by using these methods. It is, for example, easily possible to detect a short-circuit from a network wire to ground, but it is very difficult to detect an interruption of a wire.

Disturbing diagnosis systems can typically detect more failures because they do not need to avoid impairing other signals that are currently being transmitted on the network.

But, using disturbing diagnosis systems is not without risk. For example, when a car is driving, a hassle-free communication is mandatory. When disturbing measurements are intended to be used within a car network, the manufacturers have to ensure that these disturbing diagnosis systems are not accidently activated, because these tests might have an impact on the network communication. Applying a disturbing measurement may be even more difficult when a cooperation of more than one module is needed for the measurement process, because these modules may be made by different companies which can make it harder to ensure that all of the modules are perfectly working together. Therefore, disturbing measurements are typically only feasible within a special test mode, applied in a safe environment such as a garage or when the car is parked. A downside of such a test mode is that temporary failures, that can only be seen during operation, cannot be captured. Such failures may include chattering contacts (i.e., electrical contacts that can occasionally become disconnected, especially when the car is in motion), which cause communication failures during the movement of a car, or temperature effects that only occur when the car has reached its operating temperature.

Another difficulty regarding disturbing diagnosis systems, is that they might be misused on purpose. Modern cars are often connected to the Internet to provide functions like over-the-air updates (OTA). Such cars are increasingly becoming a target for hackers, who may try to misuse available functions maliciously. Disturbing diagnosis systems might be a huge risk for car manufactures, because these systems could disrupt the entire network communication if a hacker found a way to activate them outside of the desired operating conditions.

One or more of the examples of this disclosure are directed towards a way of inserting disturbing diagnosis messages into a running communication network, and to safely isolating them from regular messages. As a result, examples disclosed herein can allow the application of disturbing diagnosis techniques during the operation of a car (or other device), and therefore can extend the range of detectable issues. For example, latent failures that may have been caused by corrosion or aging effects can be found. As will be discussed below, this can be achieved by using a specific hardware for nodes which execute diagnosis measurements. The specific hardware can implement safety measures to ensure that the diagnosis hardware is only activated in synch with an appropriate section of a test message. Regular messages can be protected by hardware against erroneous distortion. The safety measures also reduce the likelihood of a hacker getting access to the diagnosis system for attacking the network communication.

Although this disclosure primarily discusses applications within the CAN network of a car, it will be appreciated that the techniques disclosed herein can also be applied to other types of message-based communication protocol and in different network applications.

To carry out a disturbing diagnosis test, as will be discussed below it is beneficial to use an appropriate test message. A payload of the test message can be divided into two parts. The first part contains a message identifier that is used for identifying the diagnosis message, and the second part consists of a test pattern that is used by the diagnosis hardware for the diagnosis measurement. This message identifier may be in addition to any standard identifying information which is typically found in a header for the communication protocol in question.

Figure 3:
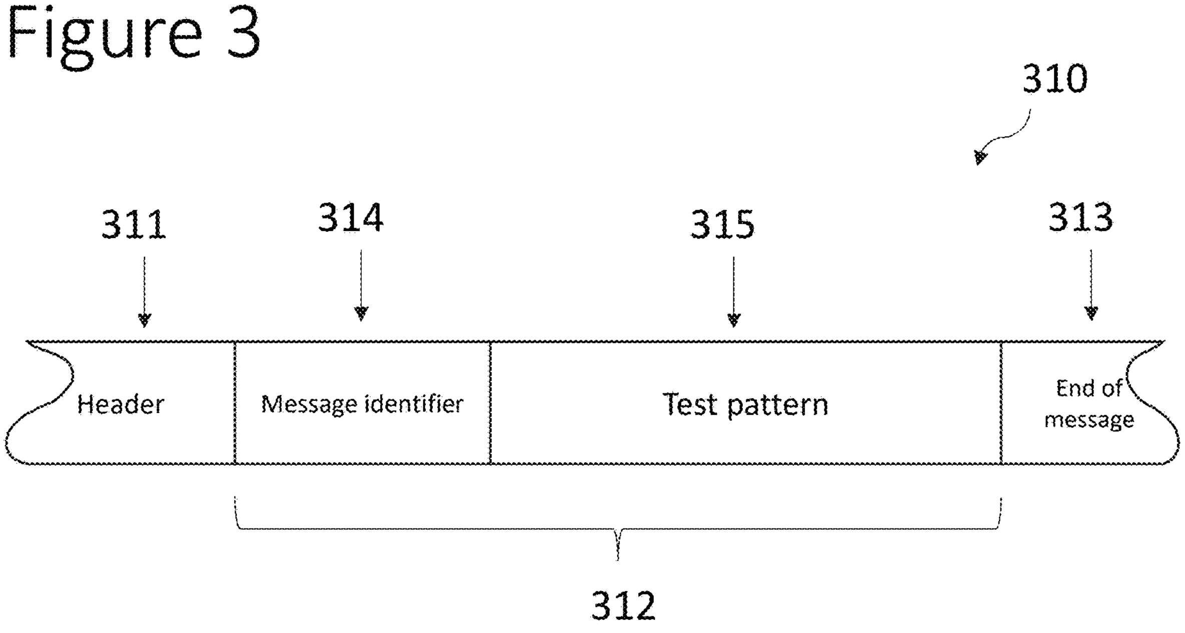
FIG. 3 shows an example disturbing diagnosis test message according to an embodiment of this disclosure.

FIG. 3 shows an example disturbing diagnosis test message 310 according to an embodiment of this disclosure. The diagnosis test message 310 includes a header 311, a payload 312 and an end of message component 313 according to the specific message-based protocol network which is being used. Typically, the header 311 contains identifying information about the message, the payload 312 contains message data and the end of message component 313 indicates the end of the message.

The diagnosis test message 310 according to an embodiment of this disclosure also includes, within its payload 312, a message identifier 314 and a test pattern 315. The message identifier 314 is a predetermined pattern which can be recognised by hardware (this is described below with reference to FIGS. 4 and 5 within the context of CAN) to identify the message as a diagnosis test message 310. The test pattern 315 is another predetermined pattern, with which the disturbing diagnosis test may be performed. The test pattern 315 in this example carries no information.

Figure 4:
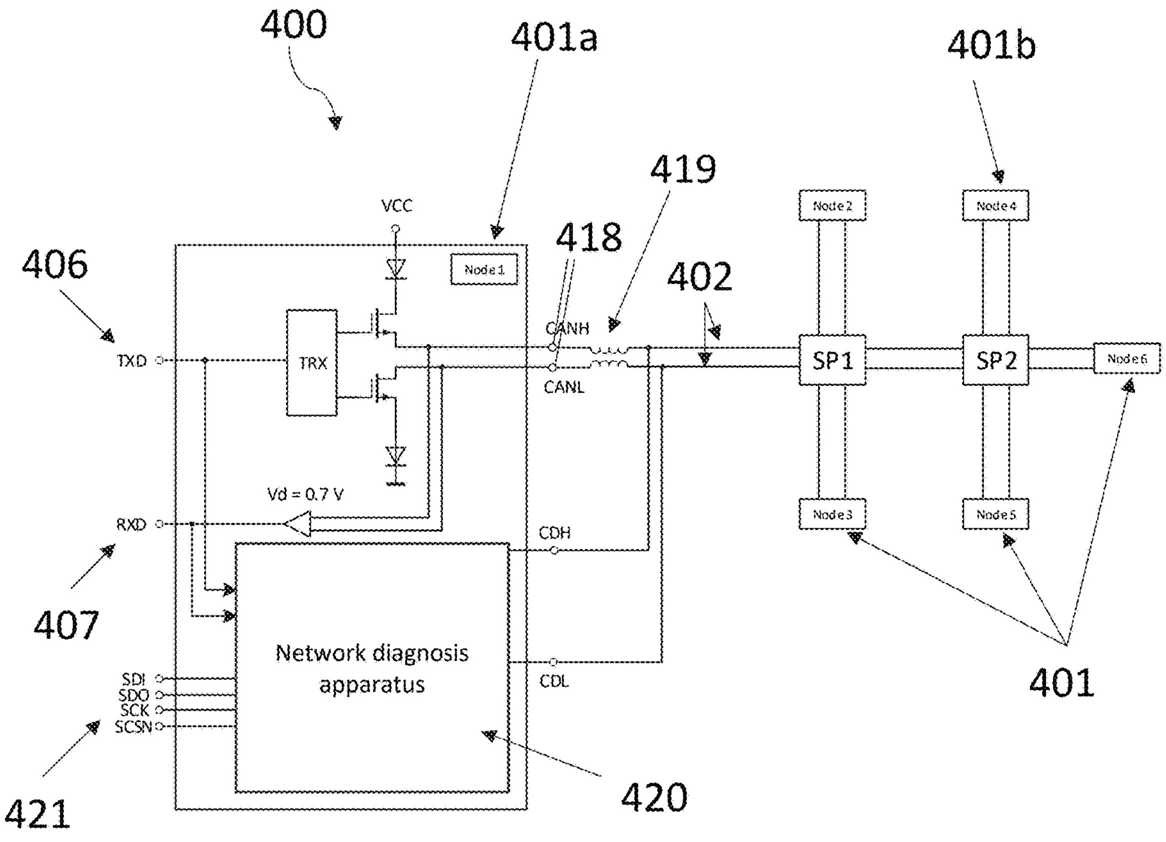
FIG. 4 shows a network which can perform disturbing diagnosis tests while the network is active according to an embodiment of this disclosure.

FIG. 4 shows a network 400 which can perform disturbing diagnosis tests while the network 400 is active according to an embodiment of this disclosure. The message-based protocol network displayed in FIG. 4 is a CAN network 400 which resembles the CAN network described in FIG. 1. In FIG. 4, one of the nodes (the one labelled as 401*a*) is shown as being associated with a network diagnosis apparatus 420. It will be appreciated any one or more of the other nodes 401 can also be associated with a network diagnosis apparatus. The network diagnosis apparatus 420 may be located within its associated node 401 (as shown in FIG. 4), or it may be located outside of its associated node 401. The network diagnosis apparatus 420 is connected to the TXD pin 406 and the RXD pin 407 of its associated node 401 such that it can process the signals that that are provided to those pins. The network diagnosis apparatus 420 is also connected to the host controller (not shown) of its associated node 401 by a communication interface 421. In this embodiment, the communication interface 421 is a serial peripheral interface (SPI), but other embodiments may include any type of bidirectional digital interface such as an inter-integrated circuit (I2C) or a universal asynchronous receiver-transmitter (UART). The communication interface 421 allows: configuration data to be sent to the network diagnosis apparatus from the host controller; and measured diagnosis test data to be provided to the host controller after a diagnosis test has been completed. In this specific embodiment, the network diagnosis apparatus 420 is connected to the bus 402 outside of its associated node 401. That is, the network diagnosis apparatus 420 has its own connection terminals (CDH, CDL) for connecting directly to the CAN bus 402. These are different to the connection terminals 418 of the associated node 401*a* that are also connected to the CAN bus 402. Advantageously, this allows the network diagnosis apparatus 420 to perform diagnosis tests on the network 400 without any influence from the common mode choke 419 that is associated with the node 401.

The network diagnosis apparatus 420 is configured to perform a network diagnosis procedure according to an embodiment of this disclosure. The network diagnosis procedure may be initiated when the network diagnosis apparatus 420 detects that the bus 402 is quiet. Any node 401 within the network which has an associated network diagnosis apparatus 420 may initiate the network diagnosis procedure. The node 401 which initiates the network diagnosis procedure will referred to as a commander node 401*a* for the duration of the network diagnosis procedure. The host controller (not shown) of a commander node 401*a* can initiate the network diagnosis procedure by transmitting (by way of the TXD pin 406 of the commander node 401*a*) a diagnosis request to a target node 401*b* (which is arbitrarily shown as Node 4 in FIG. 4). The diagnosis request includes a message identifier which, in order to continue with the network diagnosis procedure, must be identical to a predetermined diagnosis identifier which is known to the network diagnosis apparatus 420. In this way, the diagnosis request can be easily distinguished from other messages. The network diagnosis apparatus 420 detects this diagnosis request and uses the TXD pin 406 of the commander node 401*a* to verify the origin of the diagnosis request. In this example, the network diagnosis apparatus 420 receives the diagnosis request from the TXD pin 406 of the commander node 401*a*. In other examples, the network diagnosis apparatus 420 can receive the diagnosis request from an RXD pin 407 and use information on the TXD pin 406 of the commander node 401*a* in order to verify the origin of the diagnosis request. In a yet further example, the network diagnosis apparatus 420 can receive the diagnosis request directly from the CAN bus 402 and, again, use information on the TXD pin 406 of the commander node 401*a* in order to verify the origin of the diagnosis request. In any case, the network diagnosis apparatus 420 can be certain that the diagnosis request is correct and that the diagnosis request originated from (or did not originate from) the commander node 401*a*.

Once the target node 401*b* receives the diagnosis request from the commander node 401*a*, the target node 401*b* responds with a diagnosis response which includes a message identifier. Assuming no errors have occurred, the network diagnosis apparatus 420 knows to expect this diagnosis response. In order to continue with the network diagnosis procedure, the message identifier should be identical to a predetermined diagnosis identifier known to the network diagnosis apparatus 420. The diagnosis response from the target node 401*b* also includes a test pattern. In other words, the diagnosis response from the target node 401*b* resembles the diagnosis test message described in relation to FIG. 3. In some embodiments, a diagnosis request is not required to initiate a diagnosis test. In such an embodiment, the network diagnosis apparatus 420 still verifies that the diagnosis response (in this case the first message sent) has originated from a different node 401*b* than the node 401*a* which is associated with the network diagnosis apparatus. All subsequent steps are the same, irrespective of whether or not a diagnosis request had been sent.

The diagnosis response is received by the network diagnosis apparatus 420 by way of the RXD pin 407 of the commander node 401*a*. By simultaneously listening to the TXD pin 406 of the commander node, the network diagnosis apparatus 420 can determine that the diagnosis response originated from a node 401 which is not the commander node 401*a*. This ensures that two independent nodes are required to communicate before any disturbing diagnosis tests may be performed on the network. This advantageously lowers the risk of a disturbing diagnosis test being performed at the wrong time for two reasons. Firstly, the chance of two nodes cooperating to begin a disturbing diagnosis test by mistake is lower than one node initiating a disturbing diagnosis test by mistake. Secondly, the requirement for two separate nodes to cooperate in order to initiate a disturbing diagnosis test increases the difficulty for any outside parties to maliciously instigate disturbing diagnosis tests within the network.

In this embodiment, once the network diagnosis apparatus 420 has received the diagnosis request from the commander node 401*a* and the diagnosis response from the target node 401*b*, the network diagnosis apparatus 420 compares the message identifiers of the diagnosis request and the diagnosis response with a predetermined diagnosis identifier. In another embodiment, the diagnosis request and diagnosis response are compared to the predetermined diagnosis identifier as soon as they are received. The predetermined diagnosis identifier may be hardcoded, and it may be a specific checksum or cyclic redundancy check (CRC) code. If both message identifiers are identical to the predetermined diagnosis identifier, then the network diagnosis apparatus 420 performs a diagnosis test using the test pattern in the diagnosis response from the target node 401*b*.

The network diagnosis procedure may be used to sequentially perform a diagnosis test for each node 401 in the message-based protocol network.

If an error-frame occurs, the sending node 401 may repeat the message which would be successful because the network diagnosis apparatus 420 will be inactive until a new diagnosis request is sent. In this way, the potential disruption to network communication is reduced.

Figure 5:
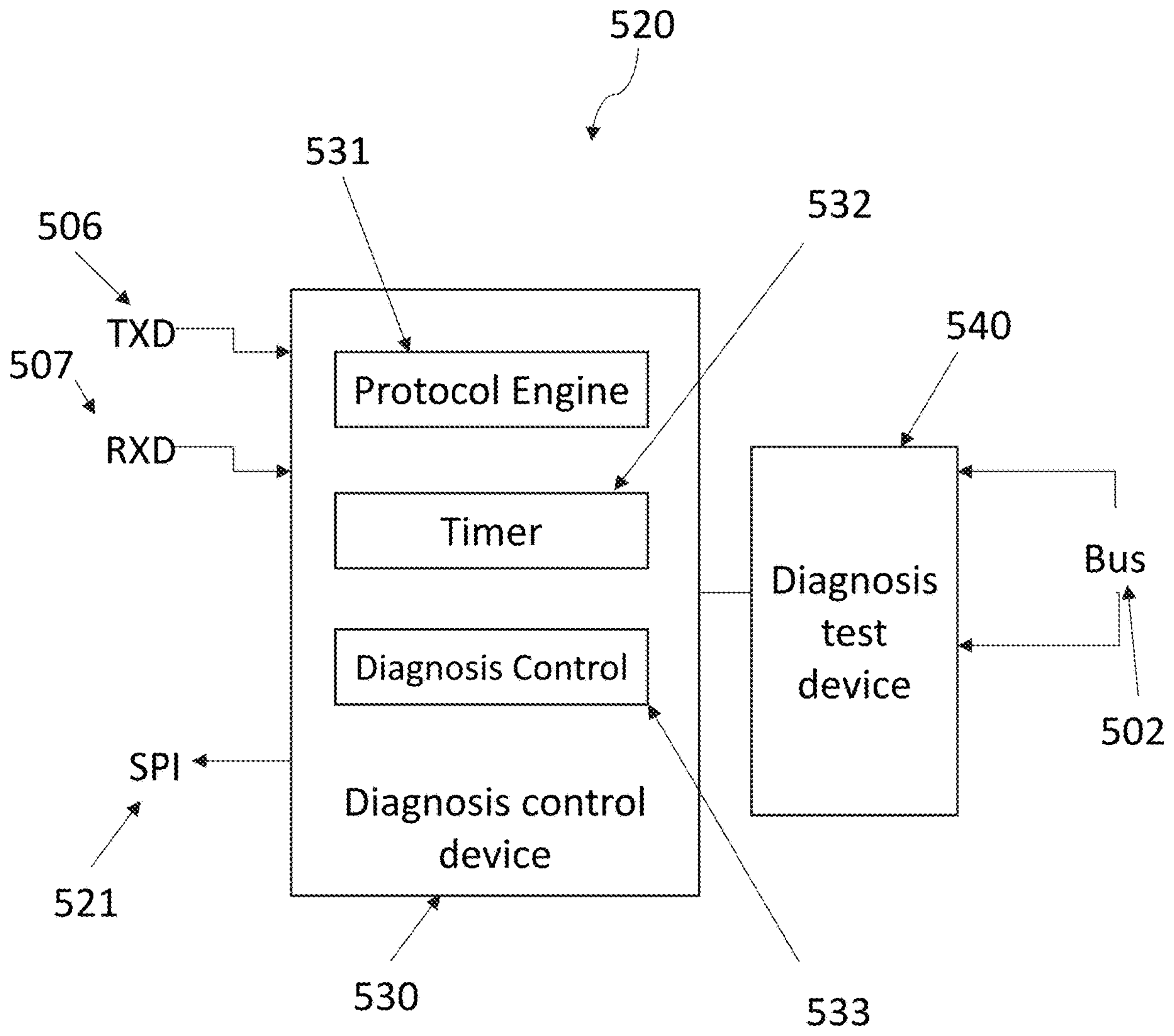
FIG. 5 shows the structure of a network diagnosis apparatus according to an embodiment of the present disclosure.

FIG. 5 shows the structure of a network diagnosis apparatus 520 according to one embodiment of the present disclosure. The network diagnosis apparatus 520 includes a diagnosis control device 530 and a diagnosis test device 540. The diagnosis control device 530 is connected to the TXD pin 506 and RXD pin 507 (or equivalent) of a node within the network. The diagnosis control device 530 may include a voltage meter (not shown) for receiving signals. The diagnosis control device 530 is also connected to the controller associated with the node by way of a communication interface 521. The diagnosis test device 540 is connected to the diagnosis control device 530 and the bus 502 of the network.

In this embodiment, the diagnosis control device 530 includes a protocol engine 531 (according to the specific network protocol in use), a timer 532 and a diagnosis control module 533. The diagnosis control device 530 can use the protocol engine 531 to identify a diagnosis request from the TXD pin 506 of its associated node, and also to identify a diagnosis response from the RXD pin 507 of its associated node. Alternatively, as indicated above, the diagnosis control device 530 can use the protocol engine 531 to identify both a diagnosis request and a diagnosis response from the RXD pin 507 and use the TXD pin 506 to verify the origin of each message. The diagnosis control device 530 uses the protocol engine 531 to compare the message identifiers of the diagnosis request and the diagnosis response with a predetermined diagnosis identifier. Only if the message identifiers of the diagnosis request and the diagnosis response are identical to the predetermined diagnosis identifier, will the diagnosis control device 530 use the protocol engine 531 to automatically execute the diagnosis measurements according to the received test pattern. To achieve this, first the protocol engine 531 activates the diagnosis control module 533. The diagnosis control module 533 activates the diagnosis test device 540 and the protocol engine 531 uses the diagnosis test device 540 to perform the diagnosis test according to the test pattern of the diagnosis response. In some embodiments, the protocol engine 531 synchronises the diagnosis control module 533 with the diagnosis response to ensure that the diagnosis test device 540 only performs the diagnosis test according to the test pattern of the diagnosis response. In some examples, the test pattern may be structured differently in order to perform different types of diagnosis tests. In such examples, the protocol engine 531 synchronises the diagnosis control module 533 in order to perform a diagnosis test at the appropriate times and according to the specific requirements of the test pattern.

For example, the test patten may be structured to include pauses, perhaps to check for other activity within the network.

In this embodiment, the diagnosis control device 530 also includes a timer 532. After the diagnosis control device 530 receives and correctly identifies a diagnosis request from the TXD pin 506, the protocol engine 531 may activate the timer 532. If a diagnosis response is not received by the diagnosis control device 530 within a predetermined time period of the timer 532 starting, the diagnosis control device 530 will cease activity until another diagnosis request is received and verified with activity on the TXD pin 506. In this way, the diagnosis test device 540 cannot perform a disturbing diagnosis test unless a diagnosis response is received within the predetermined time period. Therefore, the chance of the network diagnosis apparatus 520 performing an unwanted or poorly timed disturbing diagnosis test within the network can be reduced. Therefore, a timer 532 can beneficially add an additional level of safety to the network.

Figure 6:
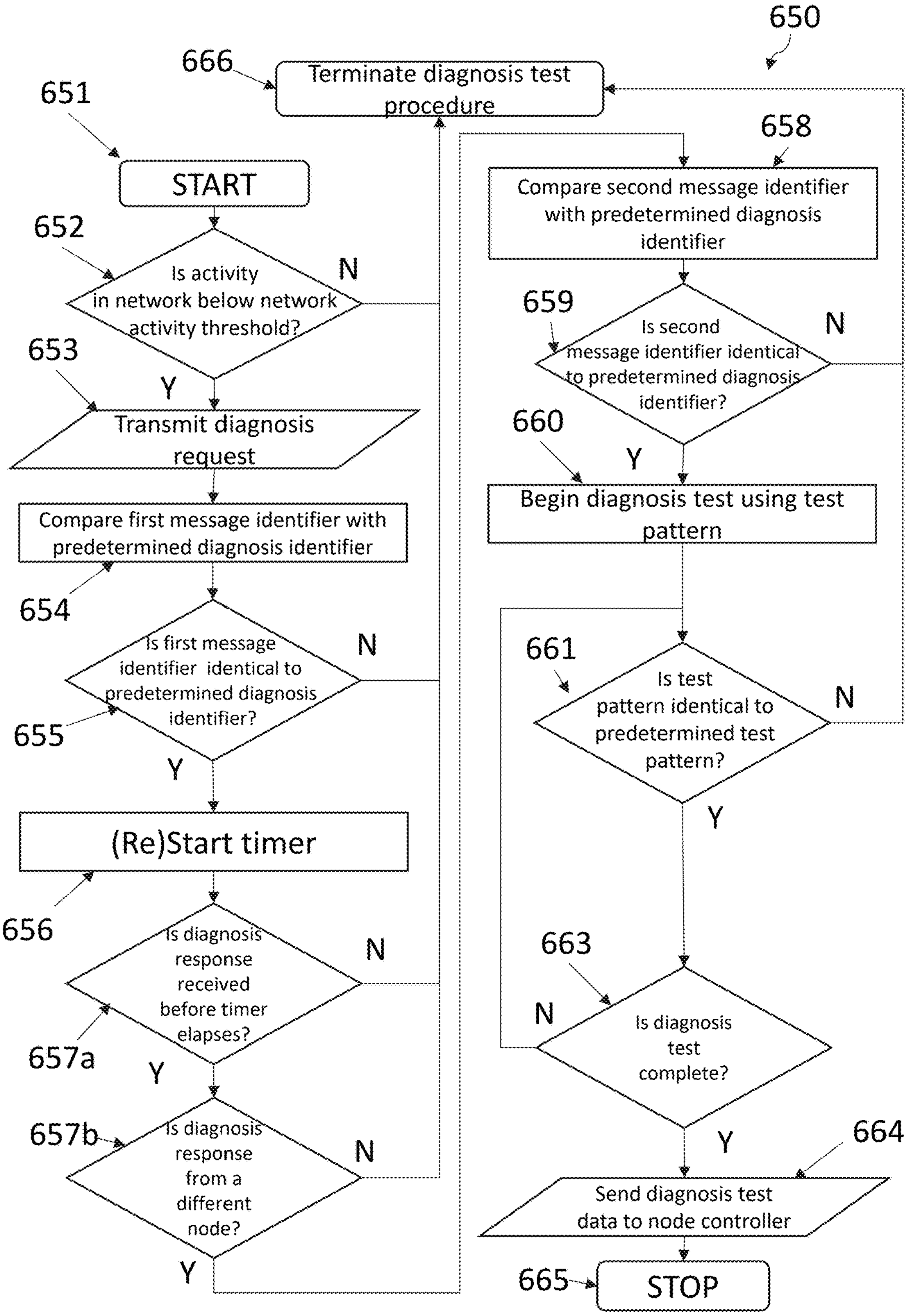
FIG. 6 shows a flowchart that illustrates a method of performing a diagnosis test procedure according to an embodiment of the present disclosure.

FIG. 6 shows a flowchart that illustrates a method of performing a diagnosis test procedure 650 according to an embodiment of the present disclosure. The majority of the method of FIG. 6 is performed by a network diagnosis apparatus, which, as discussed above, has an associated commander node and node controller. In this embodiment, the diagnosis test procedure includes some additional safety features, as will be discussed below.

When a commander node wishes to begin 651 the network diagnosis procedure 650, the first step is for the commander node to check for activity on the network 652. If the activity on the network is above a network activity threshold 652, then the diagnosis test procedure 650 is terminated 666. That is, the commander node does not send out a diagnosis request and therefore the network diagnosis apparatus does not perform any processing in relation to the network diagnosis procedure 650. The diagnosis control device can send an error message to the node controller. In this way, the likelihood of a disturbing diagnosis test being performed at a time when the network is active is reduced. If the activity on the network is below a threshold value 652, the diagnosis test procedure 650 proceeds to the next step of the flow chart.

Next the node controller to transmit a diagnosis request 653 which is directed to a target node and also received by the network diagnosis apparatus. The diagnosis request includes a first message identifier, as described above with reference to FIG. 4. The network diagnosis apparatus then compares the first message identifier with a predetermined diagnosis identifier 654. If the first message identifier is not identical to a predetermined diagnosis identifier 655, the diagnosis test procedure 650 is terminated 666. That is, the diagnosis control device sends an error message to the node controller and ceases all activity until instructed otherwise. In this way, the network diagnosis apparatus will not execute a disturbing diagnosis test in response to a transmission which is not a diagnosis request. This reduces the risk of an unwanted disturbing diagnosis test being carried out. If the first message identifier is identical to the predetermined diagnosis identifier 655, then the diagnosis test procedure 650 proceeds to the next step.

Next, the network diagnosis apparatus starts a timer 656 (or the network diagnosis re-starts a timer 656 if, for any reason, the timer was already active). If the period of time since the timer was started 656 reaches a threshold period of time before a diagnosis response is received 657*a*, the diagnosis test procedure 650 is terminated. In this way, this allowable response time enables the network diagnosis procedure to restart in the event the diagnosis request is ignored, or the diagnosis response is lost for any reason. As discussed above in relation to FIG. 4, two nodes are required to initiate a disturbing diagnosis test for safety and security purposes. Therefore, the network diagnosis apparatus checks that the diagnosis response has originated from a different node to the commander node 657*b*. Therefore, if a diagnosis response, including a second message identifier and a test pattern, is received from a different node, before the threshold time period is reached after the timer was started 657*a*, 657*b*, then the network diagnosis test procedure 650 continues.

Next, the network diagnosis apparatus compares the second message identifier with the predetermined diagnosis identifier 658. If the second message identifier is not identical to the predetermined diagnosis identifier 659, then the network diagnosis test procedure 650 is terminated 666. In this way, the network diagnosis apparatus will not execute a disturbing diagnosis test in response to a transmission that is not a diagnosis response. This reduces the chance of a disturbing diagnosis test being performed by mistake and also increases the difficulty for a hacker to initiate disturbing diagnosis tests with the intention of disrupting the network. This increase in security can be further enhanced by using a predetermined diagnosis identifier that is hardcoded. This is because it cannot be manipulated by a third party. Either way, if the second message identifier is identical to the predetermined diagnosis identifier, then the network diagnosis procedure 650 proceeds.

Next, the network diagnosis apparatus begins a disturbing diagnosis test using the test pattern in the diagnosis response 660. The network diagnosis apparatus has access to a predetermined test pattern in memory. As discussed above, the predetermined test pattern may be hardcoded in memory. If the network diagnosis apparatus detects an unexpected bit in the test pattern from the diagnosis response 661, then the network diagnosis procedure 650 is terminated 666. That is, if the received test pattern is not identical to the predetermined test pattern, then the network diagnosis procedure 650 is terminated 666. In this way, if, for any reason, the disturbing diagnosis test has been started by mistake, the disturbing diagnosis test will be immediately cancelled in order to minimise the risk of disturbing important signals within the network. Additionally, the requirement to use a predetermined test pattern also increases the difficulty for a hacker to maliciously execute disturbing tests within the network. If an unexpected bit is not detected within the test pattern from the diagnosis response 661, the network diagnosis procedure 650 may proceed.

In a message-based protocol network, each message can be assigned a priority value. This priority value is used to determine which messages take priority in the event that a plurality of nodes try to transmit messages at the same time. Techniques which can be used to assign priority values and coordinate data transmission based on message priority value are known in the art and fall outside the scope of this disclosure. In the present disclosure, a disturbing network diagnosis test is assigned a low priority value. This is in order to prevent the disturbing network test from delaying important signals within the network that may be more directly related to safety. In this way, the disturbing diagnosis test can have a reduced impact on the other messages within the network. This may enable crucial messages to be sent and received within the network during the test, which otherwise may not have been possible.

The previous step of ensuring that the test pattern is as expected 661 is repeated until the disturbing diagnosis test is complete 663. If at any time during the disturbing diagnosis test, the test pattern presents an unexpected bit 661, the network diagnosis procedure 650 is terminated 666.

If the disturbing diagnosis test is completed 663 without being terminated 666 for any reason (wherein any instance of termination 666 results in the network diagnosis apparatus not performing any processing in relation to the network diagnosis procedure 650 until another diagnosis request is received), then the network diagnosis apparatus sends the results of the disturbing diagnosis test to the node controller 664. The node controller may store or interpret the disturbing diagnosis test data as appropriate. The network diagnosis test procedure is now complete 665.

As will be understood, a disturbing diagnosis test is performed within a network using a predetermined test pattern. The disturbing diagnosis test can be immediately terminated in the event of any unexpected occurrence within the network. In this way, the impact of a disturbing diagnosis test on the other messages within a network can be minimised, thus allowing the execution of disturbing diagnosis tests within an active network. This combination of safety elements allows the diagnosis test apparatus to be safely used side-by-side with regular network communication. Therefore, failures that only occur during the operation of the network can be detectable by executing a disturbing diagnosis test as described herein.

Figure 7:
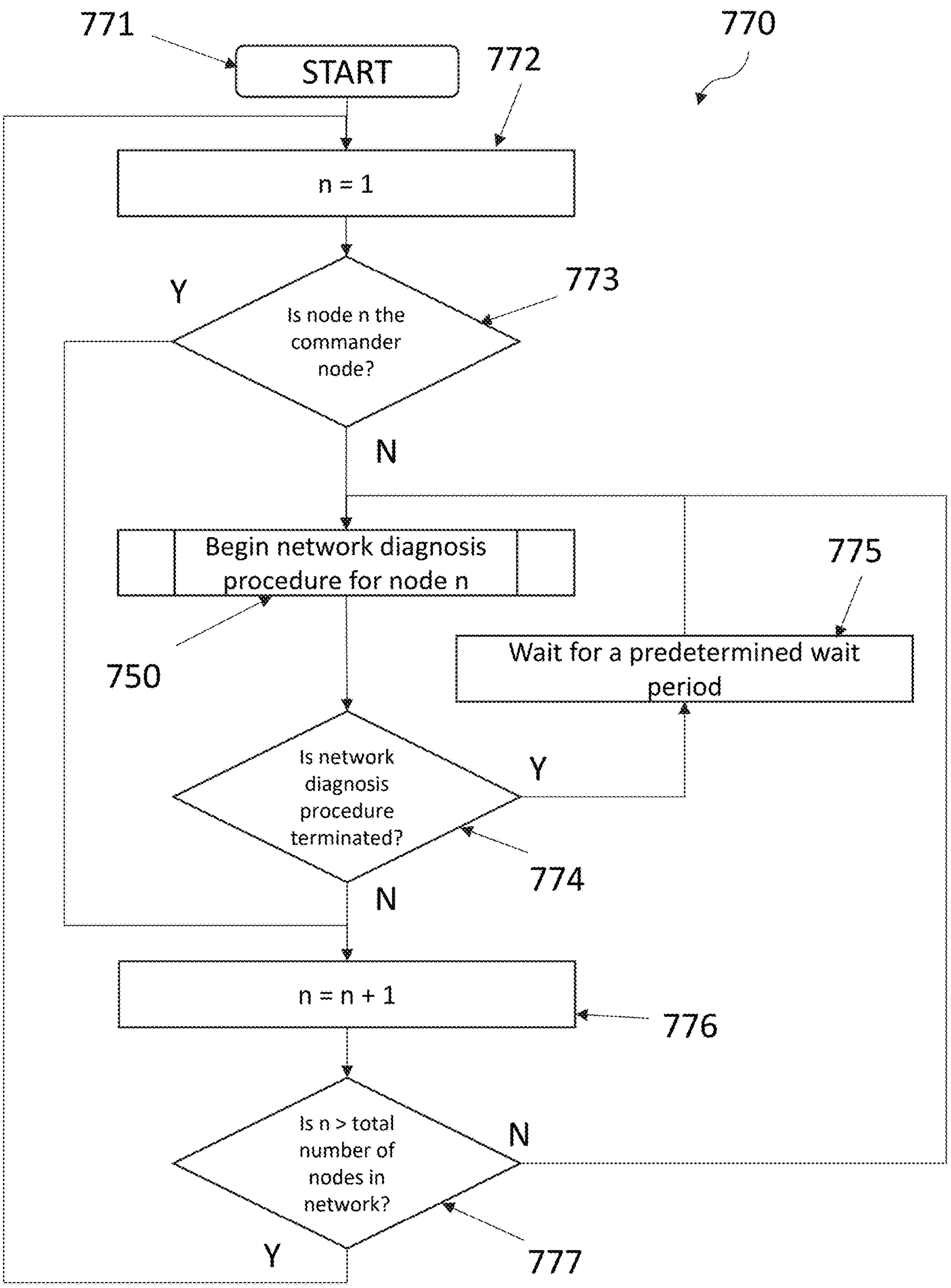
FIG. 7 shows a flowchart to outline an overall network diagnosis according to an embodiment of the present disclosure.

FIG. 7 shows a flowchart to outline an example overall network diagnosis 770 according to an embodiment of the present disclosure. As described above in relation to FIG. 2, it may be beneficial to locate the position of a fault within a network. Therefore, the method described in relation to FIG. 2 may be combined with the network diagnosis procedure described in relation to FIG. 6 to provide a complete example of how the techniques of this disclosure may be used within a network.

First, the overall network diagnosis procedure is begun 771 and a naming variable n is assigned an initial value 772. The naming variable and values defined herein are merely arbitrarily assigned exemplary values and any reasonable alternatives may also be used. In this example, n=1 where n corresponds to a number assigned to each node within the network and the node numbering begins at 1 and is increased by 1 for each node until each node has been assigned a number.

If node n is not the commander node 773, a network diagnosis procedure 750 (similar to the network diagnosis procedure described above, in relation to FIG. 6) is performed for node n. In this embodiment, if, for any reason, the network diagnosis procedure 750 is terminated 774, the commander node may wait for a predetermined wait period 775. After waiting for the predetermined wait period 775, the commander node may once again begin the network diagnosis procedure for node n 750. In this way, any other messages which may be present in the network are given time to be processed. In some other embodiments, if the network diagnosis procedure 750 is terminated 774, an error message is sent to the node controller associated with the commander node. In said embodiments, the commander node processes the error message and may initiate another diagnosis test procedure for any node within the network, at any future time and for any reason.

If the network diagnosis procedure 750 is completed 774—that is, the network diagnosis procedure 750 is not terminated 774—the naming variable n is incremented by 1 776. In other words, n=n+1 if the network diagnosis procedure 750 completed without termination. If, previously, node n was the commander node 773, the network diagnosis procedure 750 and the following steps 774 and 775 are skipped and the naming variable is incremented by 1 776. In this way, the commander node cannot initiate a disturbing diagnosis test by itself, and an unbreakable loop is avoided. If the new value of the naming variable n is greater than the total number of nodes in the network 777, the naming variable n is reset to 1 772 and the overall network diagnosis procedure 770 may continue. If the naming variable n is not greater than the total number of nodes in the network 777, the network diagnosis procedure is begun for the new node n 750 and the overall network diagnosis procedure may continue.

If, at any time within the network diagnosis procedure 770, disturbing diagnosis test results are acquired for each node within the network (step not shown), the full data set may be analysed in order to find the location (and, in some cases, a severity) of the fault within the network. Once the location of the fault is detected, an action may be taken to fix or mitigate the impact of said fault. For example, the network may indicate the fault location to a user to allow for repairs. Any other reasonable action may be taken as a result of the fault location detection.

As will be apparent, this overall diagnosis procedure 750 is merely an example implementation of the network diagnosis procedure which may be used to locate faults within a network. Any alternative method to sequentially perform disturbing diagnosis tests on each node within a network may be implemented. In some embodiments, an alternative method to sequentially perform disturbing diagnosis tests only on a subset of the nodes within the network may be implemented.

Figure 8:
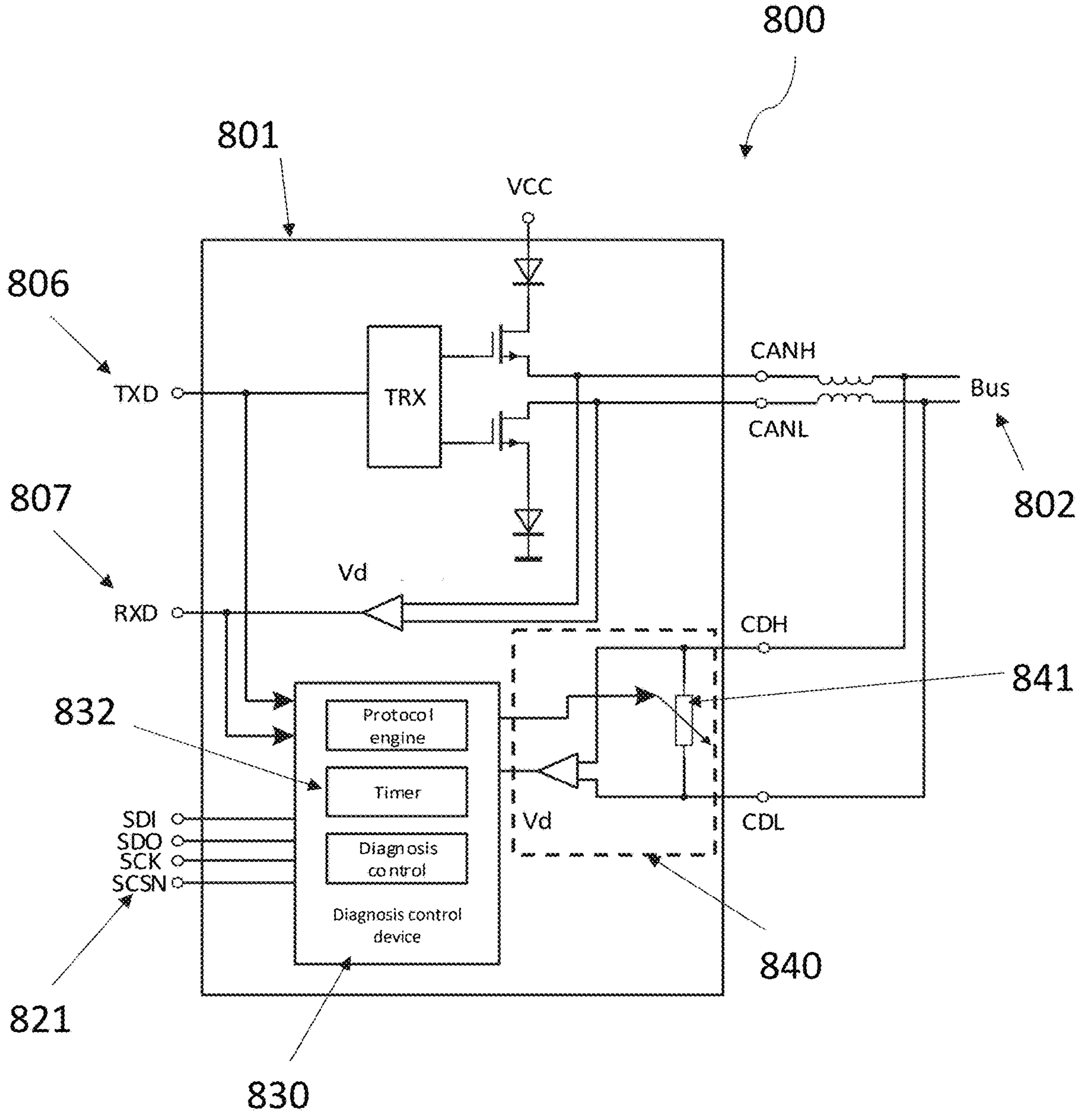
FIG. 8 shows an example apparatus which can be used to carry out a network diagnosis procedure in a CAN network according to an embodiment of this disclosure.

FIG. 8 shows an example apparatus which may be used to carry out a network diagnosis procedure in a CAN network 800 according to an embodiment of this disclosure. The CAN network 800 resembles the CAN network described above, with reference to FIGS. 1 and 4. In this example, at least one node 801 is associated with a diagnosis control device 830 and a diagnosis test device 840. In the same way as described above, the network control device 830 is connected to the TXD pin 806 and the RXD pin 807 of its associated node, and to the host controller (not shown) of its associated node 801 by a communication interface 821. The diagnosis test device 840 is connected to the diagnosis control device 830 and to the bus 802. The diagnosis test device 840 in this example includes an impedance tuner 841 connected between both wires (CANH and CANL) of the bus 802.

First, the host controller (not shown) of the commander node 801 configures the diagnosis control device 830 by way of the communication interface 821. This configuration may include sending information about the predetermined diagnosis identifier and/or information about the disturbing diagnosis test to be executed if the appropriate conditions are met. If the activity on the CAN network is below an activity threshold, the host controller (not shown) transmits a diagnosis request from the commander node 801 which is directed to a target node (not shown). The diagnosis request can be any message compatible with the CAN protocol. The message includes a message identifier, which is identical to a predetermined diagnosis identifier. The diagnosis control device 830 also receives the diagnosis request, which is intended for the target node, from the commander node 801. The diagnosis control device 830 measures activity on the TXD pin 806 to verify the origin of the message. The diagnosis control device 830 also uses data received from the RXD pin 807 to interpret the diagnosis request. This reduces the likelihood of any non-legitimate node successfully triggering a disturbing diagnosis test.

The diagnosis control device 830 compares the message identifier from the diagnosis request to a predetermined diagnosis identifier and, if the message identifier is identical to the predetermined diagnosis identifier, starts a timer 832. In order to proceed, the target node (not shown) must reply with a diagnosis response within a threshold period of time since the timer 832 was started.

Assuming normal circumstances, the target node (not shown) replies with a diagnosis response within the threshold period of time since the timer 832 was started, and this diagnosis response is received by the diagnosis control device 830 by way of the RXD pin 807. The diagnosis response is compatible with the CAN protocol and includes a header, a message identifier and a test pattern. An example diagnosis response is described below with reference to FIG. 9. The diagnosis control device 830 checks the header and compares the message identifier from the diagnosis response to the predetermined diagnosis identifier. If the message identifier from the diagnosis response is identical to the predetermined diagnosis identifier and the header is as expected, the diagnosis control device 830 proceeds with the network diagnosis procedure and may reset the timer 832. The diagnosis control device may also check signalling on the TXD pin 806 to confirm that the diagnosis response has come from a different node to the commander node 801.

In order to carry out the disturbing diagnosis test, the diagnosis control device in this example controls the timing of the diagnosis test device 840 so that the disturbing diagnosis test is only performed using appropriate parts of the test pattern within the diagnosis response. In this way, the measurement is synchronised with the diagnosis response.

In accordance with the diagnosis test protocol described above in relation to FIG. 6, the disturbing diagnosis test can be immediately terminated under any unexpected circumstances.

The disturbing diagnosis test may include the diagnosis control device 830 adjusting the resistance of the impedance tuner 841 in order to modulate the impedance on the bus 802, and then measuring the outcome. In some examples, the diagnosis control device 830 may use the impedance tuner 841 to reduce the resistance of the bus until the differential voltage between CANH and CANL drops below a predetermined threshold. Because this test is carried out on the test pattern of a message from the target node, the impedance of the network connections between the target node and the commander node can be measured, ignoring other sections of the network. As a result of this, an impedance test can be performed in this way to determine the impedance of the network in sections between each pair of nodes. Therefore, the location and severity of a fault (which affects the impedance of the network wires) can be detected as described above in relation to FIG. 2.

If the disturbing diagnosis test is completed without termination, the disturbing diagnosis test results are transmitted to the host controller (not shown) of the commander node 801 by way of the communication interface 821. The host controller (not shown) may interpret the diagnosis test results or store the diagnosis test results to be interpreted in future.

This diagnosis test procedure may be sequentially carried out for one or more of nodes in the network. Once all of the desired disturbing diagnosis tests are received by the host controller (not shown) associated with the commander node 801, the host controller may analyse the disturbing diagnosis tests in combination in order to determine the position and/or severity and/or existence of one or more faults which may be present in the network.

Figure 9:
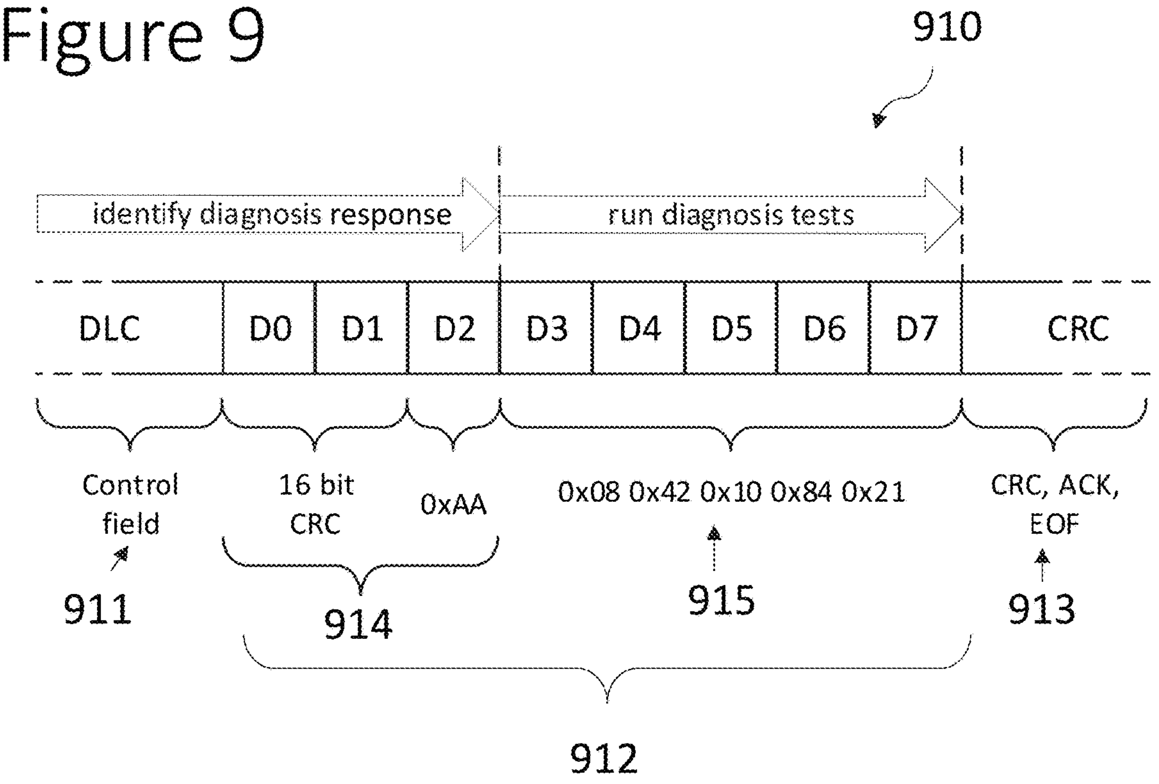
FIG. 9 shows an example structure of a diagnosis response which can be used in a CAN network according to an embodiment of the present disclosure.

FIG. 9 shows an example structure of a diagnosis response which may be used in a CAN network according to an embodiment of the present disclosure. The diagnosis response structure 910 is a specific example of the diagnosis test message that is described above in relation to FIG. 3. The diagnosis response structure 910 includes a header 911, a payload 912 and an end of message segment 913. The header 911 is a control field which includes identifying information about the message, for example a data length code (DLC) which is used to denote the length of the transmission and/or an identifier to represent the responding node from which the response has come from. The payload 912 contains a message identifier 914 and a test pattern 915. The end of message component indicates the end of the message and may include an acknowledge bit, an end of frame bit and/or a CRC which may be used for error detection as standard in a CAN protocol.

The message identifier 914 is an extension of the header 911 and may contain a specific 16-bit CRC code (D0 and D1 in FIG. 9) and this is recognised by the diagnosis control device. Since the first data bytes already include a CRC code, the identification is possible before the test pattern is started. This ensures that the disturbing diagnosis test can be started safely. The message identifier 914 may also include an additional pattern (D2 in FIG. 9) which may be used to help the diagnosis control device to synchronise the diagnosis test device in order to precisely perform the disturbing diagnosis test. The additional pattern may also prevent stuff bits from being inserted into the test pattern. The additional pattern may be 0xAA. The additional pattern may also provide a time window for the diagnosis control device to monitor the TXD pin in order to ensure that the diagnosis response has originated from a different node in the network. This allows the diagnosis control device to guarantee that two different nodes are involved, before any disturbing diagnosis tests can be performed. The header 911 and message identifier 914 are used in combination to identify the diagnosis response.

The test pattern 915 may be configured in such a way that no stuff bits can be inserted into the test pattern, therefore even a flipped bit would not trigger a stuff-error. The test pattern 915 may include only five data bytes and therefore a form-error is not possible. Bit-errors can only be detected by the transmitting node. A CRC-error or an Acknowledge-error can only occur after the test pattern 915. If a node detects a bit flip, it may raise a CRC-error and this information could be used for further analysis in case of an error. The test pattern does not carry any information.

In one specific example, the test pattern 915 may consist of four dominant bits followed by a recessive bit. This can be achieved using the pattern 0x08 0x42 0x10 0x84 0x21 (D3 to D7 in FIG. 9). In this way, for example, an impedance test can be performed on the dominant bits and the impedance test can be paused to check for activity on the network in the recessive bits. Before performing a disturbing diagnosis test according to this example, the diagnosis control device is synchronised with the test pattern 915 such that the disturbing diagnosis test is performed during the dominant bits and paused during the recessive bits of this test pattern 915.

Figure 10:
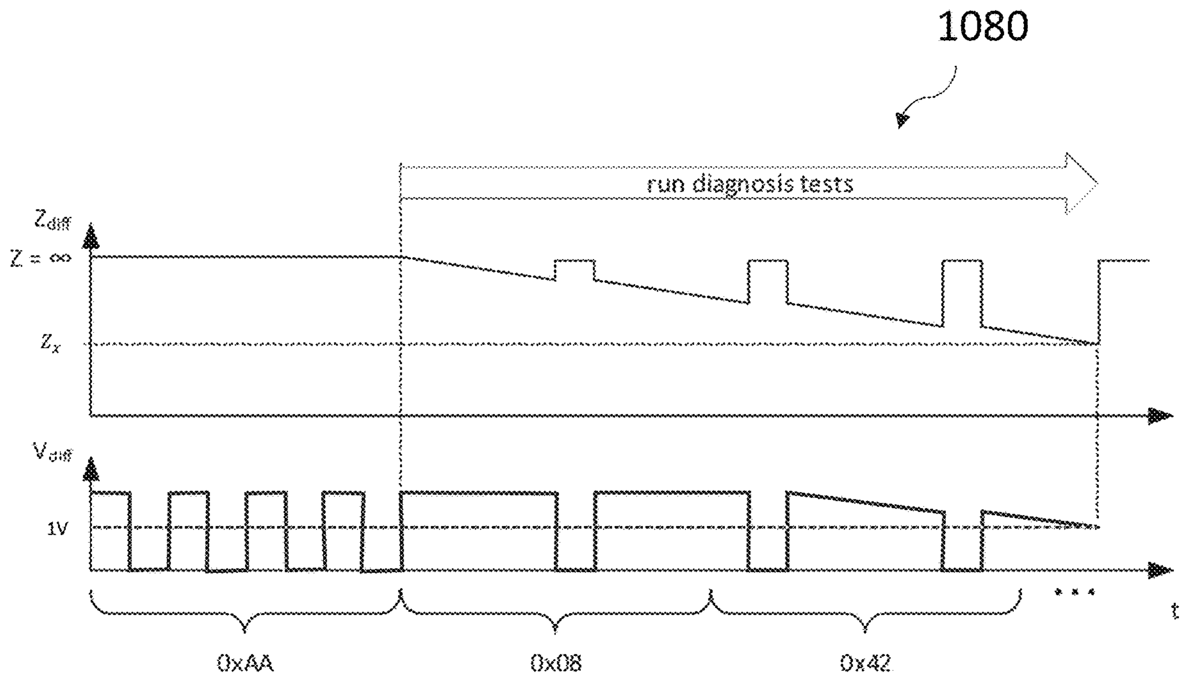
FIG. 10 shows an example of a disturbing diagnosis test which can be performed in a CAN network using the diagnosis test device of FIG. 8.

FIG. 10 shows an example of a disturbing diagnosis test 1080 which can be performed in a CAN network using the diagnosis test device of FIG. 8. The disturbing diagnosis test 1080 in this example involves gradually decreasing the impedance of the impedance tuner until the differential voltage between CANH and CANL, as detected by the receiver of the associated node drops below a voltage threshold. In the example of FIG. 10, the voltage threshold is 1V. After this voltage threshold is reached, the measurement process is completed and the measured impedance value can be read out via the communication interface.

After the disturbing diagnosis test 1080 is complete for a target node, another disturbing diagnosis test 1080 may be initiated for a different target node at a future time when the network activity is below a predetermined activity threshold.

Other suitable disturbing diagnosis tests may be performed in addition or instead of the one represented by FIG. 10 using apparatus or methods according to this disclosure.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An apparatus configured to perform a network diagnosis procedure within a message-based protocol network comprising a plurality of nodes, the apparatus comprising:

a diagnosis test device configured to perform diagnosis tests; and a diagnosis control device wherein, in order to perform the network diagnosis procedure, wherein the diagnosis control device is configured to:

receive a diagnosis request from a commander node wherein the diagnosis request is directed to a target node, and wherein the diagnosis request comprises a first message identifier, wherein the diagnosis request is provided from the commander node to both the diagnosis control device and the target node;

compare the first message identifier to a predetermined diagnosis identifier;

receive a diagnosis response from the target node, wherein the diagnosis response comprises a second message identifier and a test pattern;

compare the second message identifier to the predetermined diagnosis identifier; and in response to determining that the first message identifier and the second message identifier are identical to the predetermined diagnosis identifier, use the diagnosis test device to perform a diagnosis test using the test pattern.

2. The apparatus of claim 1, wherein the diagnosis test is a disturbing diagnosis test.

3. The apparatus of claim 2, wherein the disturbing diagnosis test is configured to disturb other signals in the message-based protocol network.

4. The apparatus of claim 1, wherein the message-based protocol network is a controller area network, CAN, which comprises a first and second bus wire coupled to each node within the network.

5. The apparatus of claim 4, wherein:

the diagnosis control device is configured to receive the diagnosis request from a transmit data, TXD, pin of the commander node; and the diagnosis control device is configured to receive the diagnosis response from a receive data, RXD, pin of the commander node.

6. The apparatus of claim 1, wherein the diagnosis control device further comprises a timer, wherein:

the diagnosis control device is configured to start the timer in response to it receiving the diagnosis request; and the diagnosis control device is configured to terminate the network diagnosis procedure if the diagnosis control device does not receive the diagnosis response from within a predetermined time period of the timer starting.

7. The apparatus of claim 1, wherein the diagnosis control device is configured to terminate the network diagnosis procedure in response to determining that:

the first message identifier is not identical to the predetermined diagnosis identifier; or the second message identifier is not identical to the predetermined diagnosis identifier.

8. The apparatus of claim 1, wherein the diagnosis control device is configured to terminate the network diagnosis procedure in response to determining that the test pattern is not identical to a predetermined test pattern.

9. The apparatus of claim 8, wherein the predetermined test pattern is hardcoded.

10. The apparatus of claim 1, wherein the diagnosis response comprises a header and a payload, and wherein the test pattern is contained within the payload of the diagnosis response.

11. The apparatus of claim 1, wherein the predetermined diagnosis identifier is hardcoded.

12. The apparatus of claim 1, wherein the apparatus is configured to sequentially perform a diagnosis test for each node in the message-based protocol network.

13. A method for performing a network diagnosis procedure within a message-based protocol network, the method comprising:

receiving, by a diagnosis control device, a diagnosis request from a commander node wherein the diagnosis request is also directed to a target node, wherein the diagnosis request comprises a first message identifier, and wherein the diagnosis request is provided to both the diagnosis control device and the target node;

receiving, by the diagnosis control device, a diagnosis response from the target node, wherein the diagnosis response comprises a second message identifier and a predetermined test pattern;

performing, by the diagnosis control device, comparisons of each of the first message identifier and the second message identifier to a predetermined diagnosis identifier; and determining, by the diagnosis control device based on the comparisons, to perform a diagnosis test on the predetermined test pattern or to terminate the network diagnosis procedure.

14. The method of claim 13, further comprising:

in response to determining that the first message identifier and the second message identifier are identical to the predetermined diagnosis identifier, using a diagnosis test device to perform the diagnosis test on the predetermined test pattern.

15. The method of claim 13, further comprising:

in response to determining that the first message identifier and the second message identifier are not identical to the predetermined diagnosis identifier, terminating the network diagnosis procedure.

* * * * *